United States Patent
Blauvelt et al.

(10) Patent No.: US 6,493,132 B1
(45) Date of Patent: Dec. 10, 2002

(54) MONOLITHIC OPTICALLY PUMPED HIGH POWER SEMICONDUCTOR LASERS AND AMPLIFIERS

(75) Inventors: Henry A. Blauvelt, San Marino; Robert M. Lammert, Monrovia; Jeffrey E. Ungar, Valley Village, all of CA (US)

(73) Assignee: Agere Systems Guardian Corp., Miami Lakes, FL (US)

( * ) Notice: Subject to any disclaimer, the term of this patent is extended or adjusted under 35 U.S.C. 154(b) by 0 days.

(21) Appl. No.: 09/783,706

(22) Filed: Feb. 14, 2001

(Under 37 CFR 1.47)

(51) Int. Cl.$^7$ .............. H01S 3/00; H01S 5/00
(52) U.S. Cl. ........................ 359/344; 372/50
(58) Field of Search ............. 359/333, 344; 372/50, 38.06, 70, 75

(56) References Cited

U.S. PATENT DOCUMENTS

| | | | | |
|---|---|---|---|---|
| 5,623,363 A | * | 4/1997 | Liou | 359/344 |
| 5,673,141 A | * | 9/1997 | Gambini | 359/341 |
| 6,347,108 B2 | * | 2/2002 | Jiang et al. | 372/50 |

* cited by examiner

Primary Examiner—Mark Hellner
(74) Attorney, Agent, or Firm—Christie, Parker & Hale, LLP

(57) ABSTRACT

The present invention, a monolithic, high power, single mode electro-optic device is disclosed. The electro-optic device generally includes an electrically pumped device with a pn junction and an optically pumped device evanescently coupled to the electrically pumped device. In operation the electrically pumped device is driven by an external source into a high energy state to emit photons at a first wavelength. The optically pumped device is at a low energy state so as to absorb the emitted photons and re-radiated light at a second wavelength.

31 Claims, 7 Drawing Sheets

MONOLITHIC OPTICALLY PUMPED HIGH POWER SEMICONDUCTOR LASERS AND AMPLIFIERS

FIELD OF THE INVENTION

This invention relates generally to optical communications, and more particularly to high power semiconductor lasers and amplifiers.

BACKGROUND

Optical fiber communication systems preferably provide low loss and high information carrying capacity. In a typical optical fiber communication system, fiber amplifiers are used to maintain the amplitude of the signal and the integrity of the data it carries between a source and destination. However, as optical fiber systems increase in size and complexity, so does the need for higher output power fiber amplifiers and lasers.

The output power of semiconductor pump lasers and integrated laser amplifiers comprising a semiconductor laser optically coupled to a power amplifier is generally limited either by thermal effects or by beam instabilities. For example, the overall output power may be increased by the area of the device that is pumped. However, there are limitations on the size of the area that may be efficiently pumped. For example, if the width of the device is increased, the optical waveguide may support multiple spatial modes, potentially decreasing the stability of the beam. Further, if the length is increased, the output power may saturate when the internal optical losses become large compared to the mirror losses. Similarly, the operating current density and therefore the output power of a laser is often limited to avoid excessive device heating.

Recently, cladding pumped fiber lasers have been utilized to overcome the deficiencies of semiconductor pump lasers. Cladding pumped fiber lasers (i.e., the combination of a light source and a cladding pumped fiber) are advantageous in that they allow the coupling and magnification of light from high-power diode-laser arrays into a single mode fiber. However, cladding pumped lasers are often long in length and include non-circular inner cladding designs to more effectively couple the output of the laser diode into the cladding. Such designs are difficult to fabricate and to align with and splice to conventional transmission fiber.

Therefore, while good results have been obtained from cladding pumped fiber lasers, it would be advantageous to provide a high power semiconductor pump laser that can be readily coupled into a single mode fiber, wherein the laser has a reduced system size and cost.

SUMMARY OF THE INVENTION

In one aspect of the present invention, a monolithic, high power, single mode electro-optic device includes an electrically pumped device with a pn junction and an optically pumped device evanescently coupled to the electrically pumped device. In operation the electrically pumped device is driven by an external source into a high energy state to emit photons at a first wavelength. The optically pumped device is at a low energy state so as to absorb the emitted photons and re-radiated light at a second wavelength.

BRIEF DESCRIPTION OF THE DRAWINGS

These and other features, aspects, and advantages of the present invention will become better understood with regard to the following description, appended claims, and accompanying drawings, in which:

DETAILED DESCRIPTION OF THE INVENTION

An exemplary embodiment of the present invention combines a high power electrically pumped laser or integrated laser amplifier with a low loss optically pumped laser or integrated laser amplifier to provide a high power, single mode pump laser or laser amplifier. The integration of an electrically pumped device with an optically pumped device preferably overcomes the deficiencies of conventional electrically pumped lasers in high power, single mode applications. For example, in an exemplary embodiment of the present invention, the optically pumped device may have lower internal optical losses and be more resistant to beam instabilities than conventional electrically pumped devices. In addition, the output beam of the present invention may be efficiently coupled into a single mode optical fiber.

In order to appreciate the advantages of the present invention, it will be beneficial to describe the invention in the context of an exemplary electrically pumped laser or integrated laser amplifier. Typically, the material composition of the electrically pumped and optically pumped device is some combination of group III-V compound semiconductors, such as GaAs/AlGaAs, InGaAs/AlGaAs or InP/InGaAsP. However, other direct bandgap semiconductor materials may also be used. The semiconductor material body can be formed with a homostructure, single heterostructure or a double heterostructure or multi-heterostructure. All such structures include an active light emitting region near a pn junction in the body. The active region may be a single active layer, a single quantum well structure or a multiple quantum well structure.

In an exemplary embodiment of the present invention, the electrically pumped device is an integrated laser amplifier. Integrated laser amplifiers combine a semiconductor laser and a power amplifier for emission of high power laser light. In the described exemplary embodiment, the semiconductor light generating device may comprise a laser diode optically coupled to an optical power amplifier.

Figure 1:
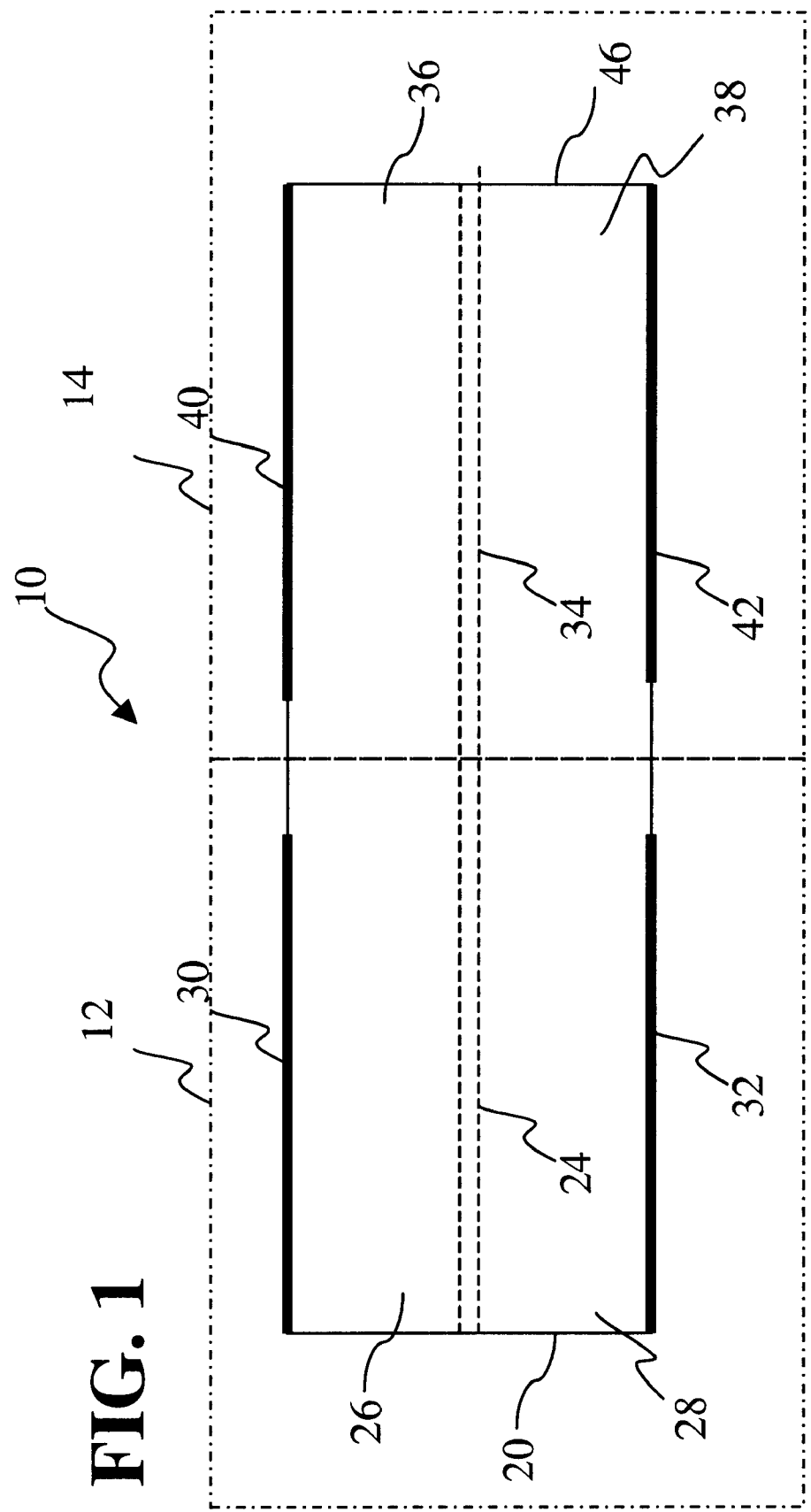
FIG. 1 is a cross-section of an integrated laser amplifier in accordance with an exemplary embodiment of the present invention.

FIG. 1 is a cross-sectional view of an integrated laser amplifier 10, comprising a semiconductor laser diode 12 and optical power amplifier 14. As is well known in the art the integrated laser amplifier may be epitaxially grown, doped, and contacted. In addition, facets 20 and 46 may receive coatings or other treatment to adjust the amount of optical feedback in the laser diode.

As is conventional in the art, laser diode 10 comprises an active region 24 disposed between a p-type layer 26 and an n-type layer 28. In one embodiment, active region 24 may comprise at least one small-bandgap InGaAsP active layer sandwiched between a pair of InGaAsP confinement layers. One of skill in the art will appreciate that the fractional concentrations of In, Ga, As and P may be varied to provide bandgap energy levels as may be preferable for the formation of the laser diode and low loss optical waveguide.

The semiconductor layers 26 and 28 may be formed from a larger-bandgap semiconductor material such as, for example, InP, creating an optical waveguide in a plane perpendicular to the junction. In an exemplary embodiment, the p-type layer may be doped with suitable dopants known in the art, such as, for example, zinc (Zn) and the n-type layer may be doped with a suitable dopant such as, for example, silicon (Si).

Further the laser diode preferably includes a p-type contact 30 and an n-type contact 32 that are used to inject current into the laser diode. In operation, when the p-n junction is forward biased, carriers (electrons and holes) are injected into and contained within active region 24, and light is generated when oppositely charged carriers recombine.

The optical amplifier 14 may be similar to the laser diode except that the facets are non reflecting. The optical amplifier utilizes stimulated photon emission to raise the power or intensity of the laser light emitted through its output facet without interfering with the coherence properties of the light. The optical amplifier therefore, also comprises an active region 34 disposed between p-type layer 36 and an n-type layer 38 of semiconductor material as previously described. The optical amplifier also includes p-type and n-type contacts 40 and 42 respectively, to receive a constant direct electric current. In the described exemplary embodiment, the optical amplifier does not modulate the transmit signal. Rather the optical amplifier simply amplifies with fidelity digital signals of appropriate input power.

Figure 2:
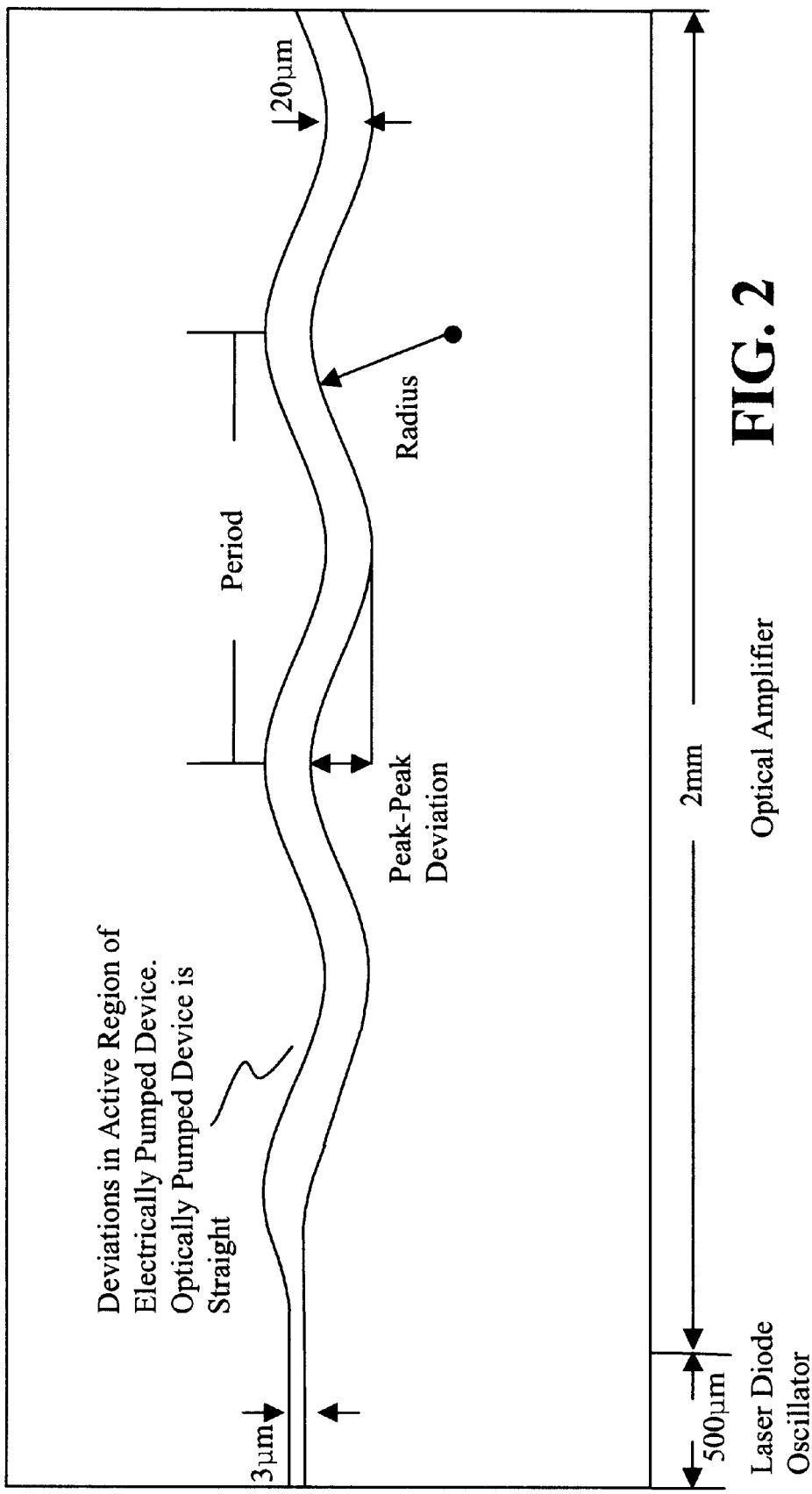
FIG. 2 is a top view of the integrated laser amplifier of FIG. 1 wherein the active region of the optical amplifier diverges in the forward direction.

Referring to the top view of FIG. 2, in the described exemplary embodiment the optical amplifier is formed so that its active region diverges in the forward direction. At the entrance of the optical amplifier 14, the active region 34 has approximately the same junction-plane or lateral dimension as does the active region 24 of the laser diode. The lateral dimension of the active region of the optical amplifier increases with increasing distance in the direction of exit facet 46. In one embodiment, the active region grows from approximately three microns at the entrance facet of the optical amplifier to an exit width of approximately twenty microns for a three millimeter amplifier. One of skill in the art will appreciate that the present invention is not limited to a particular integrated laser amplifier design. Rather the present invention may be practiced with a plurality of electrically pumped lasers or integrated laser amplifiers known in the art. Therefore, the disclosed integrated laser amplifier is by way of example only, and not by way of limitation.

Figure 3:
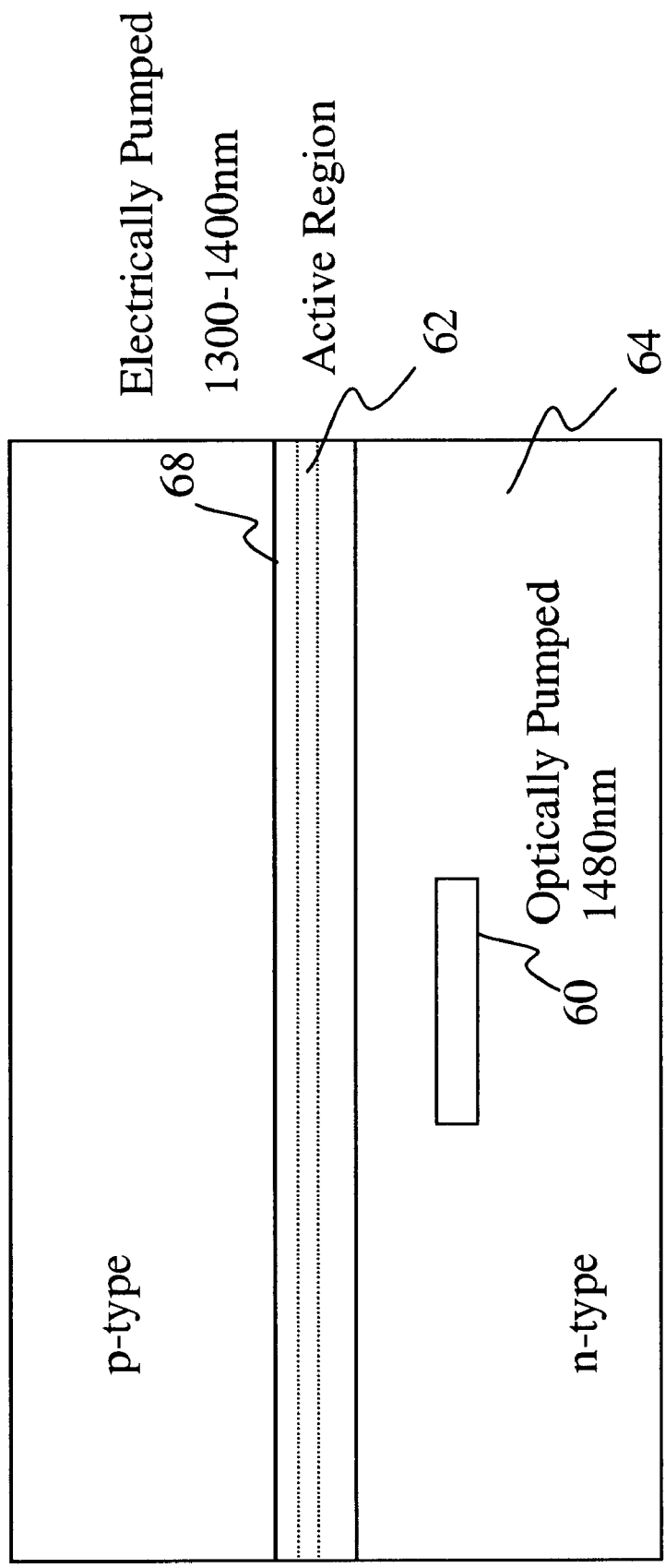
FIG. 3 is a cross-section of a monolithic, optically pumped semiconductor laser having a low loss optical waveguide centered below an electrically pumped device in accordance with an exemplary embodiment of the present invention.

Referring to the cross-section of FIG. 3, in an exemplary embodiment of the present invention, the optically pumped device may comprise a low loss optical waveguide 60. The low loss optical waveguide is preferably centered above or below an optical cavity 68 of the electrically pumped device, preferably in low loss n-type material 64. The optically pumped waveguide preferably operates in a single mode over the entire length of the device.

In an exemplary embodiment, the optically pumped waveguide 60 has a lower bandgap than electrically pumped active region 62. Therefore, the optically pumped waveguide 60 absorbs the photons generated at a first wavelength by the electrically pumped active region 62 and re-radiates photons at a second, longer wavelength.

Figure 4:
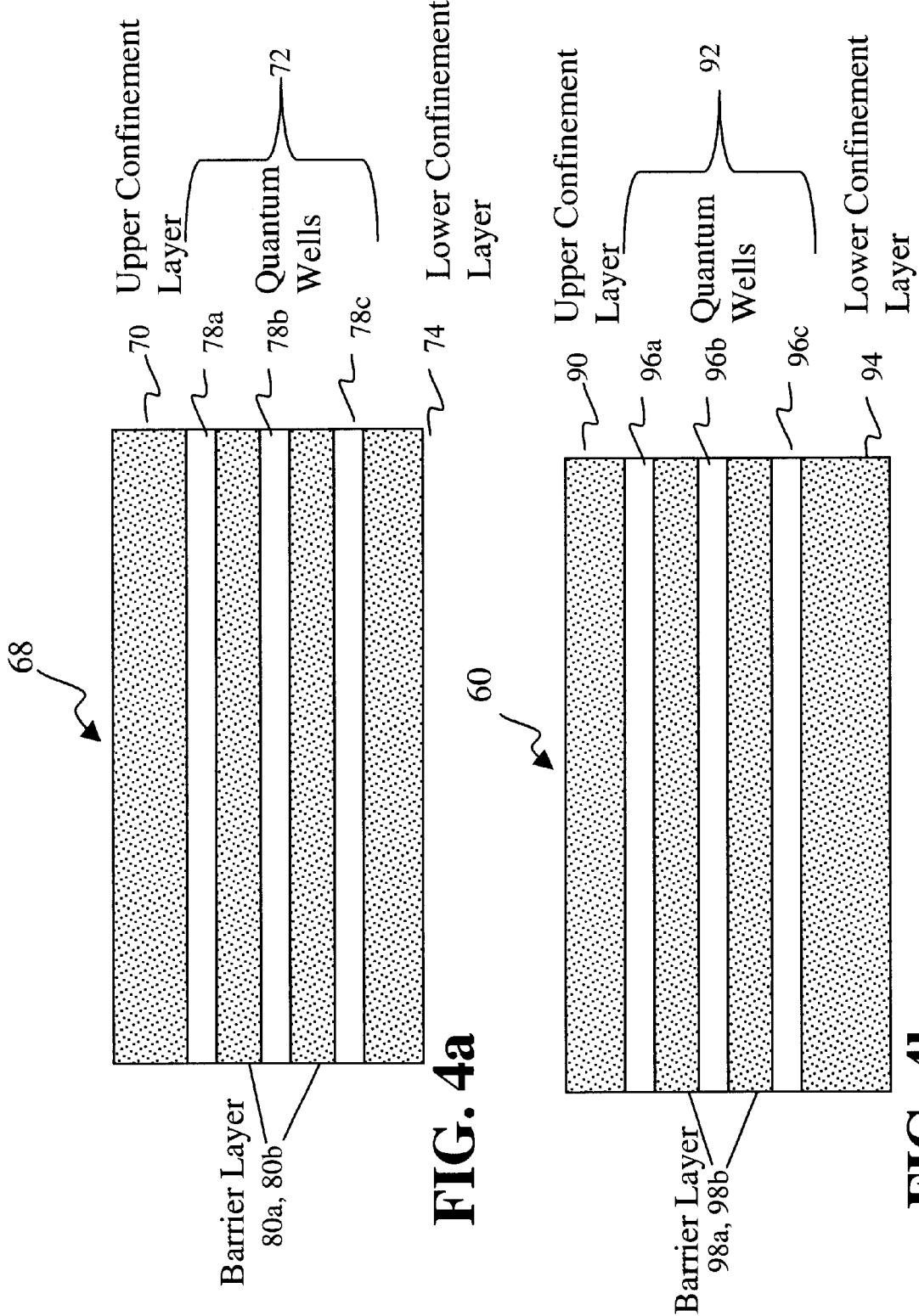
FIG. 4a is a cross-section of an optical cavity of an electrically pumped device having multiple wells in accordance with an exemplary embodiment of the present invention.
FIG. 4b is a cross-section of an optical cavity forming a low loss optical waveguide, wherein said optical cavity includes multiple wells in accordance with an exemplary embodiment of the present invention.

Referring to the cross-section of FIG. 4a, in one embodiment the optical cavity 68 of the electrically pumped device comprises an upper InGaAsP confinement layer 70, an active region 72 and a lower InGaAsP confinement layer 74. The confinement layers preferably have an energy bandgap intermediate between the energy bandgaps of the active region 72 and the adjacent InP semiconductor material (not shown). Thus, the confinement layers serve to confine the generated light, creating an optical cavity or waveguide. In this embodiment, the light generated by the optically pumped device is emitted from an edge of the device along a path that is parallel to the junction plane of the active layer of the electrically pumped device.

The active region 72 of the electrically pumped device may include one or more quantum-wells separated by barrier layers as may be preferable for the formation of the laser diode and low loss optical waveguide. The quantum-wells provide quantum confinement of electrons and holes therein to enhance recombination for the generation of the light.

Referring to the cross-section of FIG. 4b, in one embodiment the low loss optical waveguide 60 comprises an optical cavity formed from an upper InGaAsP confinement layer 90, an active region 92 and a lower InGaAsP confinement layer 94. The confinement layers preferably have an energy bandgap intermediate between the energy bandgaps of the active region 92 and the adjacent InP semiconductor material (not shown). Thus, the confinement layers serve to confine the generated light, creating an optical cavity or waveguide. In this embodiment, the light generated by the optically pumped device is emitted from an edge of the device along a path that is parallel to the junction plane of the active layer of the electrically pumped device.

The active region 92 of the optically pumped devices may include one or more quantum-wells 96a, 96b, 96c separated by barrier layers 98a, 98b as may be preferable for the formation of the laser diode and low loss optical waveguide. The quantum-wells provide quantum confinement of electrons and holes therein to enhance recombination for the generation of the light.

In the described exemplary embodiment the electrically pumped device operates at a wavelength that is less than the emission wavelength of the optically pumped device. For example, if the optically pumped device emits at wavelength in the range of about 1480–1500 nm, the electrically pumped device may be at a wavelength in the range of about 1280–1320 nm.

The low loss optical waveguide allows for the integration of two advantageous design aspects into the optically pumped device. First, the cavity length may be increased before the gain saturates. Second, the device may be operated with a reduced optical confinement factor, reducing spatial hole burning effects that are a primary cause of beam instabilities in high power pump lasers. The described exemplary embodiment, therefore addresses two of the shortcoming of current pump laser designs.

However, for effective operation it is necessary to efficiently transfer the photons generated by the electrically pumped device to the optically pumped device. In a preferred embodiment, the optical output of the electrically pumped device is evanescently coupled into the optically pumped device. In the described exemplary embodiment, the optically pumped device is integrated with the electrically pumped device so as to ensure that the optical mode of the electrically pumped device overlaps the active layer of the optically pumped device. As is known in the art, an overlap integral may be calculated to determine the modal overlap of a given electrically pumped device and optically pumped device. The modal overlap will vary in accordance with a plurality of factors including, the size and positioning of the optically pumped device relative to the electrically pumped device as well as the size of the active region of the electrically pumped device.

In the described exemplary embodiment, the main loss mechanism for the electrically pumped device is preferably the optical loss that results from pumping the optically pumped device. The absorption from the optically pumped active region preferably increases the optical loss incurred by the electrically pumped device by approximately 20–50 cm$^{-1}$. However, the optical loss should not excessively increase the threshold current of the electrically pumped device. Further, the absorption coefficient of the optically pumped device typically approaches about 10,000 cm$^{-1}$. Therefore, the modal overlap of the electrically pumped device with the active layer of the optically pumped device is on the order of about a few tenths of a percent.

Further, the optical transfer efficiency from the electrically pumped device to the optically pumped device is the ratio of the pumping loss to the total losses of the electrically pumped device. For example, if the optical loss that results from pumping the optically pumped device is 40 cm$^{-1}$ and the remaining combined losses for the electrically pumped device are 10 cm$^{-1}$, then the transfer efficiency is on the order of about 80%. The electrically pumped device is expected to have a long cavity length, preferably in the range of about two-four millimeters, to reduce the effects of mirror loss and increase the transfer efficiency. The length of the electrically pumped device is sized to ensure that the optically pumped device substantially absorbs the light emitted by the electrically pumped device for a given modal overlap.

In the described exemplary embodiment, the optical pumping of the low loss optical waveguide introduces optical loss only in the region of the electrically pumped device that is above the optically pumped waveguide. In operation, the electrically pumped device may only lase in areas of the optical cavity that are subject to the lowest loss. Consequently, if the optically pumped waveguide is maintained in a fixed lateral location relative to the electrically pumped device, the optical beam within the electrically pumped device may deform, so as to largely avoid overlapping with the optically pumped device.

Therefore, referring back to FIG. 2, a presently preferred embodiment of the integrated laser amplifier includes periodic deviations in the position of the electrically pumped device. The peak-peak deviations are preferably sized to ensure that the optically pumped device fully intersects the lazing paths of the electrically pumped device. In the described exemplary embodiment, the width of the electrically pumped device is slightly larger, typically on the order of the width of the optically pumped device, than the periodic deviations in the position of the electrically pumped device.

Therefore, as the peak to peak deviation is increased, the maximum area that may be electrically pumped also increases as does the potential power capability of the device. However, the effective pumping loss for the electrically pumped device drops because the fraction of the electrically pumped device that is in close proximity to the optically pumped device decreases. Thus the modal overlap between the electrically pumped and optically pumped device is reduced with a corresponding decrease in transfer efficiency.

The period of the positional deviations is preferably comparable to or less than the characteristic length of optical absorption (other than pumping) in the electrically pumped device. Otherwise power saturation and reduced efficiency will occur in the electrically pumped device between locations where power is transferred. In addition, the radius of curvature for the deviations is preferably large to avoid optical losses due to scattering off the curved surfaces. The peak-peak deviation (P-P) may be determined in accordance with the following formula:

$$P-P = 2\text{Radius} - \frac{\sqrt{16\text{Radius}^2 - \text{Period}^2}}{2}$$

The peak-peak deviation for various combinations of period of the positional deviations and corresponding radii of curvature are listed in Table 1.

TABLE 1

| Period ($\mu$m) | Radius ($\mu$m) | Peak-Peak Deviation ($\mu$m) |
|---|---|---|
| 400 | 1000 | 10 |
| 600 | 1000 | 22.5 |
| 800 | 1000 | 40 |
| 800 | 2000 | 20 |
| 1000 | 2000 | 32 |

Although various beam deformations and changes in intensity profile are expected as the signal propagates down the electrically pumped device, the periodic deviations allow for a relatively constant rate of power transfer to the optically pumped device. Advantageously, the beam stability requirements for the electrically pumped device are not as stringent as for a normal pump laser because there is no requirement to couple this power into a single mode fiber. Distortion of optical phase fronts is therefore not of direct concern so long as the intensity profile maintains a sufficiently high overlap with the optically pumped layer.

One of skill in the art will appreciate that the present invention is not limited to the disclosed exemplary integrated amplifier structure. Rather, any electrically pumped laser or amplifier that can efficiently transfer optical power to the optically pumped device may be used. Therefore, the disclosed integrated laser amplifier configuration is by way of example only and not by way of limitation.

Figure 5:
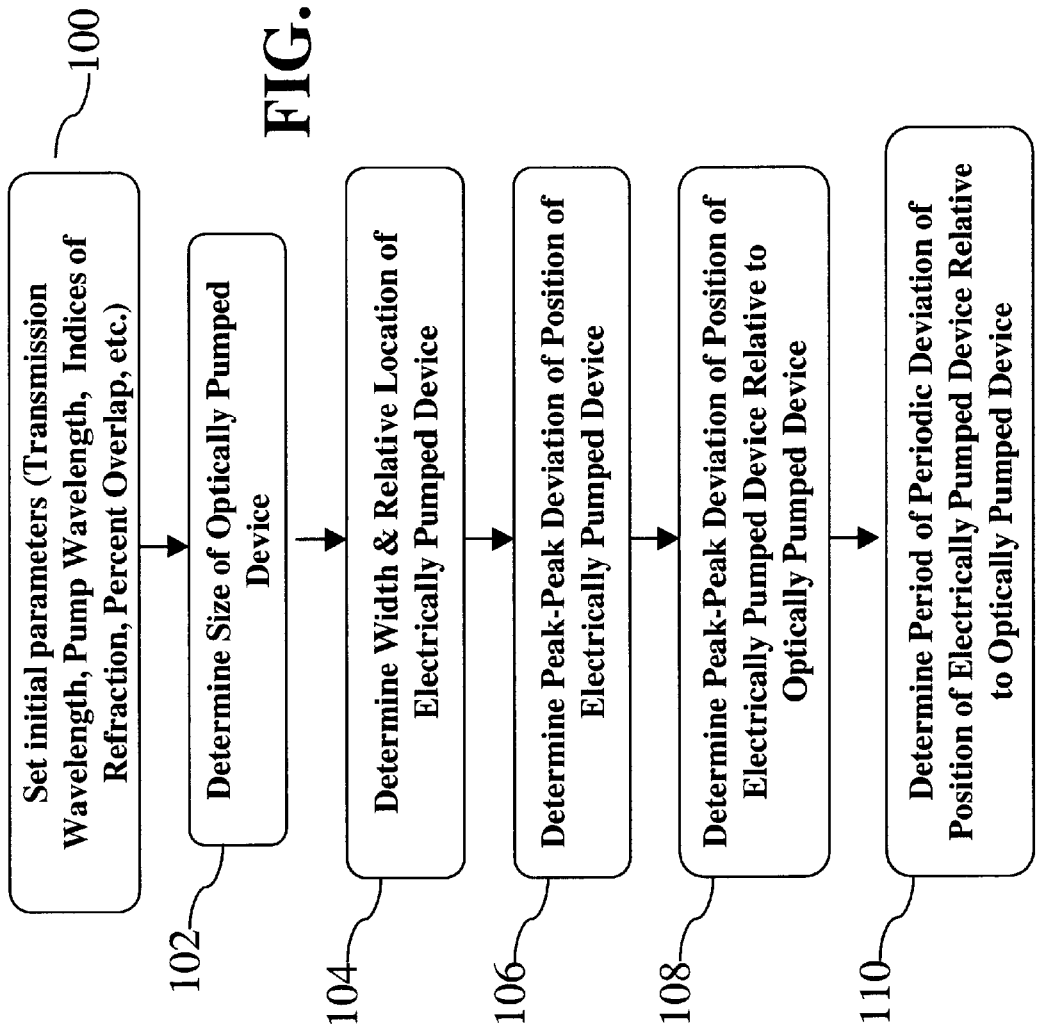
FIG. 5 is a flow chart illustrating an exemplary design process for developing a monolithic, optically pumped semiconductor laser in accordance with an exemplary embodiment of the present invention.

The design of a monolithic, optically pumped semiconductor laser may proceed in accordance with the flow chart illustration shown in FIG. 5. To proceed, the initial design parameters are established 100. For example, a user may define an emission wavelength for the optically pumped device. The optically pumped device may then be designed for single mode operation 102 at the emission wavelength. As is known in the art, the design of the optically pumped device may depend on a variety of factors such as, for example, the index step between the cladding layer and active layer.

The user may then estimate the pumping loss of the optically pumped device designed in step 102. The pumping loss and a user defined range of optical losses for the electrically pumped device may be used to determine a preferred modal overlap of the electrically pumped device with the active layer of the optically pumped device 104. Alternatively, a user may simply define a preferred modal overlap.

The modal overlap may then be used in an overlap integral to define the width of the electrically pumped device as well as the spacing between the optically pumped and electrically pumped devices 106. Generally, the modal overlap will decrease with increasing width of the electrically pumped device as well as with increased spacing between the devices. In operation, if the electrically pumped device is widened the overlap of the horizontal field is reduced because the field is widened. Similarly, the vertical field of the light emitted by the electrically pumped device increases because the field intensity is highest near the electrically pumped active region.

A user may then use the width of the optically pumped device and the electrically pumped device to determine a preferred peak-peak deviation of the position of the electrically pumped device relative to the optically pumped device 108. In the described exemplary embodiment the peak to peak deviation is preferably set equal to the width of the electrically pumped device minus the width of the optically pumped device. The peak-peak deviation and a user defined radius may then be used to determine the period of the deviation of the position of the electrically pumped device relative to the optically pumped device 110. Generally, it is preferred to use as small a radii of curvature that provides acceptable scattering, typically on the order of about 1000 μm. One of skill in the art will appreciate that the present invention may be realized with alternate design techniques. Therefore, the disclosed design process is by way of example only, and not by way of limitation.

Figure 6:
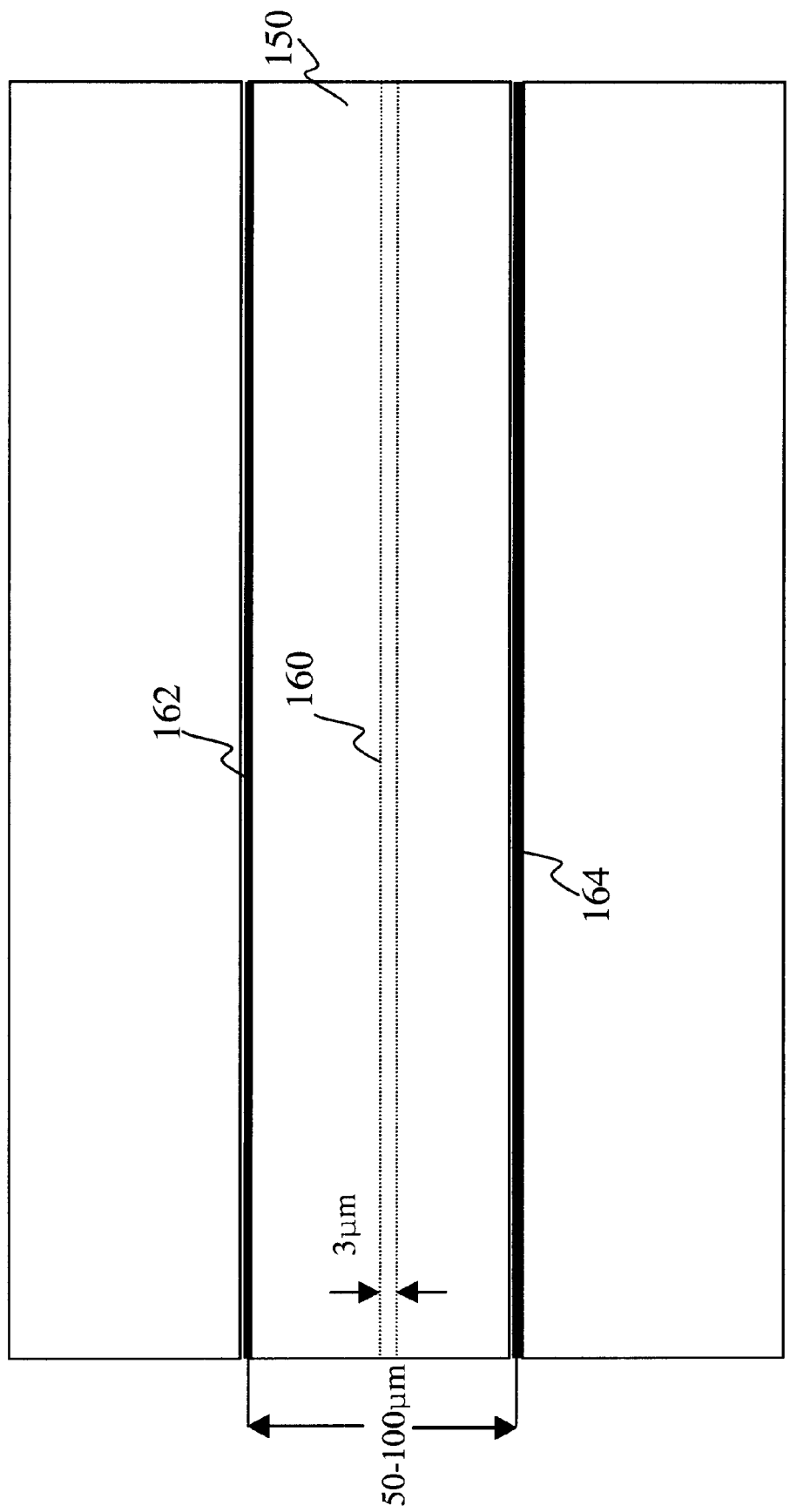
FIG. 6 is a top view of an alternate monolithic, optically pumped semiconductor laser wherein the electrically pumped device and the optically pumped device are oriented at right angles with respect to each other in accordance with an exemplary embodiment of the present invention.

Referring to the top view of FIG. 6, in an orthogonal configuration, the electrically pumped device 148 and the optically pumped device 160 are oriented at right angles with respect to each other. Advantageously, the performance of the alternate orthogonal embodiment is relatively immune to beam instabilities in the electrically pumped device. The material composition of the electrically pumped device may again be some combination of group III-V compound semiconductors, such as, for example, GaAs/AlGaAs, InGaAs/AlGaAs or InP/InGaAsP.

Figure 7:
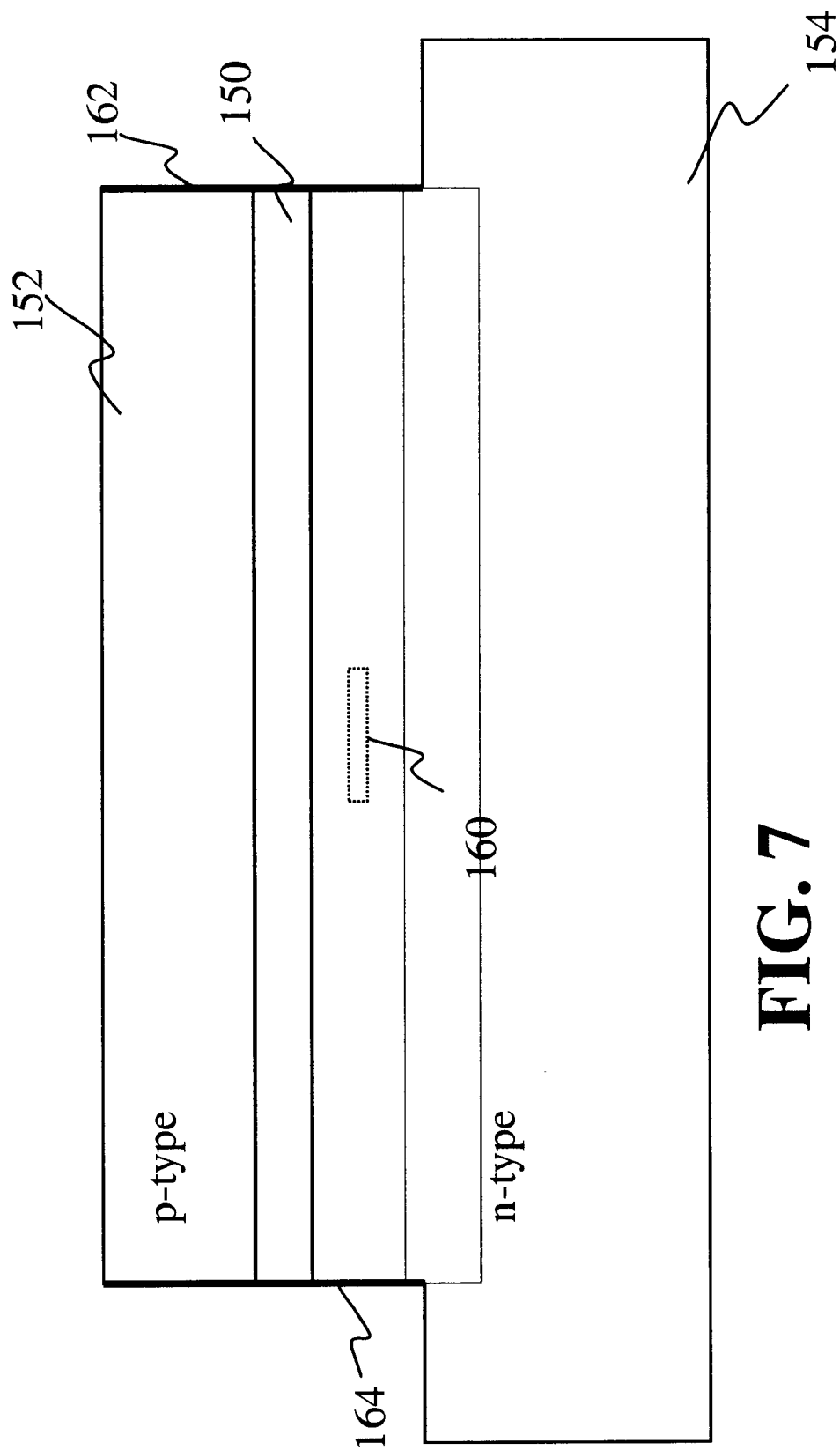
FIG. 7 is a cross-section of the alternate monolithic, optically pumped semiconductor laser of FIG. 6 in accordance with an exemplary embodiment of the present invention.

Referring to the cross-section of FIG. 7, in one embodiment the electrically pumped device may comprise a laser diode having active region 150 disposed between a p-type layer 152 and an n-type layer 154 of semiconductor material. The active region preferably forms a wide width, short length optical cavity. In one embodiment, active region 150 may comprise at least one small-bandgap active InGaAsP layer sandwiched between a pair of InGaAsP confinement layers. The electrically pumped device may include a high reflectivity coating 162, 164, on both facet mirrors to increase the reflectivity of the mirrors. In one embodiment, the high reflectivity coating may comprise alternating layers of $Al_2O_3$/Si, where the thickness of each layer is one quarter of the wavelength of the emitted light.

In the described exemplary embodiment, the p-type layer may be doped with suitable dopants known in the art, such as, for example, zinc (Zn) and the n-type layer may be doped with a suitable dopant such as, for example, silicon (Si). Further the laser diode preferably includes a p-type contact and an n-type contact not shown that are used to inject current into the laser diode.

In the described exemplary embodiment, the optically pumped device 160 is located below the active region 150 of the electrically pumped device in low loss n-type material. The optically pumped device 160 may cross under the middle of the electrically pumped device. The photons generated by the electrically pumped device may again be evanescently coupled into the optically pumped device. Therefore, the vertical gap between the devices is relatively small, typically in the range of less than about 0.5 μm, to ensure sufficient overlap of the optical mode of the electrically pumped device with the active layer of the optically pumped device.

Further, in one embodiment the facet mirrors of the electrically pumped device having the high reflectivity coating may be etched to provide improved handling capability.

The optically pumped device is again a low energy device that absorbs the emitted photons and re-radiates at a second wavelength. The optically pumped waveguide preferably operates in a single mode over the entire length of the device. The optical cavity of the electrically pumped and optically pumped devices may again comprise an upper InGaAsP confinement layer, an InGaAsP active region and a lower InGaAsP confinement layer. The active region of the electrically pumped and optically pumped devices may again include one or more quantum-well layers separated by barrier layers as may be preferable for the formation of the laser diode and low loss optical waveguide. The quantum-wells provide quantum confinement of electrons and holes therein to enhance recombination for the generation of the light. As is known in the art the barrier layers and confinement layers may be formed of the same semiconductor material.

In the orthogonal configuration, the waveguide of the optically pumped device is perpendicular to the waveguide of the electrically pumped device. Thus, in this embodiment, the light generated by the optically pumped device is emitted from an edge of the device along a path that is perpendicular to the waveguide of the electrically pumped device.

The transfer efficiency for the orthogonal embodiment corresponds to the loss per pass that results from pumping the optically pumped device divided by the total loss per pass of the electrically pumped device. Therefore, to reduce the unwanted losses, the electrically pumped device includes a relatively short cavity, preferably in the range of about 50–100 μm, and high reflectivity mirrors, preferably on the order of about 90% reflectivity.

In the orthogonal configuration, the optically pumped device is limited to single pass absorption of the photons generated by the electrically pumped device. Therefore, the electrically pumped laser in the orthogonal configuration preferably emits at a wavelength that is absorbed by both the quantum wells and barrier layers within the active region of the optically pumped device to increase the modal absorption of the optically pumped device. In this instance carriers excited in the barrier layers are rapidly and efficiently captured by the quantum wells.

Generally, the modal overlap will decrease with increasing length of the electrically pumped device as well as with increasing spacing between the electrically pumped and optically pumped devices. For example, assuming a 6% overlap of the optical mode of the electrically pumped device with the active layer of the optically pumped device, a 10,000 $cm^{-1}$ absorption coefficient for the optically pumped device, and a 2.5 $\mu$m stripe width, the absorption per pass is about 15%. However, the relatively short electrically pumped cavity and high reflectivity mirrors reduce the other losses per pass for the electrically pumped device to a range of about 10–20%. Therefore, the transfer efficiency for the orthogonal embodiment is on the order of about 50%.

Although a preferred embodiment of the present invention has been described, it should not be construed to limit the scope of the present invention. Those skilled in the art will understand that various modifications may be made to the described embodiment. Moreover, to those skilled in the various arts, the invention itself herein will suggest solutions to other tasks and adaptations for other applications. It is applicant's intention to cover by claims all such uses of the invention and those changes and modifications that could be made to the embodiments of the invention herein chosen for the purpose of disclosure without departing from the spirit and scope of the invention.

What is claimed is:

1. An electro-optic device, comprising:
   an electrically pumped device having an optically pumped device monolithically formed within at least a portion of said electrically pumped device, wherein said electrically pumped device emits photons at a first wavelength and wherein said optically pumped device absorbs said photons and emits an optical wave at a second wavelength.

2. The electro-optic device of claim 1 wherein said electrically pumped device comprises an integrated laser amplifier.

3. The electro-optic device of claim 1 wherein said electrically pumped device comprises a semiconductor laser.

4. The electro-optic device of claim 1 wherein said optically pumped device comprises an optical waveguide.

5. An electro-optic device, comprising:
   an electrically pumped device comprising a first active region deposited between a p-type semiconductor layer and an n-type semiconductor layer; and
   an optically pumped device, comprising an optical waveguide, integrally formed within said n-type semiconductor layer.

6. The electro-optic device of claim 4 wherein said optical waveguide comprises a second active region.

7. The electro-optic device of claim 4 wherein said optical waveguide is parallel to a second optical waveguide formed by the first active region.

8. The electro-optic device of claim 4 wherein said optical waveguide is perpendicular to a second optical waveguide formed by the first active region.

9. The electro-optic device of claim 7 further comprising periodic deviations in position of said first active region.

10. The electro-optic device of claim 5 wherein said first active region comprises one or more quantum wells formed between a first confinement layer and a second confinement layer.

11. The electro-optic device of claim 10 wherein each of said one or more quantum wells of said first active region comprise a layer of InGaAsP.

12. The electro-optic device of claim 6 wherein said second active region comprises one or more quantum wells formed between a third confinement layer and a fourth confinement layer.

13. The electro-optic device of claim 12 wherein each of said one or more quantum wells of said second active region comprise a layer of InGaAsP.

14. A electro-optic device, comprising:
   an electrically pumped device comprising a first active region formed between first region of semiconductor material and a second region of semiconductor material;
   an optically pumped device integrally formed in one of said first or second semiconductor regions, wherein said electrically pumped device emits photons at a first wavelength and wherein said optically pumped device absorbs said photons and emits an optical wave at a second wavelength.

15. The electro-optic device of claim 14 wherein said optically pumped device comprises an optical waveguide.

16. The electro-optic device of claim 15 wherein said first semiconductor layer comprises an n-type semiconductor layer, and wherein said optically pumped device is integrated into said n-type semiconductor layer.

17. The electro-optic device of claim 15 wherein said optical waveguide comprises a second active region.

18. The electro-optic device of claim 15 wherein said optical waveguide is parallel to a second optical waveguide formed by the first active region.

19. The electro-optic device of claim 15 wherein said optical waveguide is perpendicular to a second optical waveguide formed by the first active region.

20. The electro-optic device of claim 14 further comprising periodic deviations in position of said first active region.

21. A method for transmitting a high power, single mode optical wave, comprising the steps of:
   electrically pumping an electrically pumped device to cause said electrically pumped device to emit photons at a first wavelength;
   coupling said photons into an optically pumped device integrally formed in said electrically pumped device to cause said optically pumped device to emit photons at a second wavelength.

22. A method of forming a monolithic electro-optic having an optically pumped device integrally formed in an electrically pumped device comprises:
   forming a first portion of a first semiconductor layer on a substrate;
   forming said optically pumped device on a first area of said first portion of said first semiconductor layer;
   forming a second portion of said first semiconductor layer on said optically pumped device and on a second area of said first portion of said semiconductor layer;
   forming a first active region on said second portion of said first semiconductor layer; and
   forming a second semiconductor layer on said active region.

23. The method of claim 22 wherein the step of forming said optically pumped device comprises forming a second active region on a first area of said first portion of said first semiconductor layer.

24. The method of claim 23 wherein the step of forming said second active region comprises forming a first confinement layer on a first area of said first portion of said first semiconductor layer, forming one or more quantum wells on said first confinement layer, and forming a second conefinement layer on last quantum well.

25. The method of claim 22 wherein the step of forming said first portion of said first semiconductor layer comprises forming a first n-type semiconductor layer.

26. The method of claim 25 wherein the step of forming said second portion of said first semiconductor layer comprises forming a second n-type semiconductor layer.

27. A method for producing a high power semiconductor laser, comprising the steps of:

forming a first portion of n-type semiconductor layer on a substrate;

forming an optically pumped device on a first area of said first portion of said n-type semiconductor layer;

forming a second portion of said n-type semiconductor layer on said optically pumped device and on a second area of said first portion of said n-type semiconductor layer;

forming a first active region on said second portion of said n-type semiconductor layer; and forming a p-type semiconductor layer on said active region.

28. The method of claim 27 wherein step of forming an optically pumped device comprises forming an optical waveguide on a first area of said first portion of said n-type semiconductor layer.

29. The method of claim 28 wherein the step of forming an optical waveguide comprises forming a second active region on a first area of said first portion of said n-type semiconductor layer.

30. The method of claim 28 wherein the step of forming said optical waveguide comprises forming said optical waveguide parallel to waveguide formed by the first active region.

31. The method of claim 28 wherein the step of forming said second active region comprises forming said optical waveguide perpendicular to waveguide formed by the first active region.

* * * * *